United States Patent [19]

Tamoto et al.

[11] Patent Number: 4,505,793
[45] Date of Patent: Mar. 19, 1985

[54] PHOTOPOLYMERIZABLE COMPOSITIONS

[75] Inventors: Koji Tamoto; Akira Umehara; Teruo Nagano; Masayuki Iwasaki; Yoshimasa Aotani, all of Kanagawa, Japan

[73] Assignee: Fuji Photo Film Co., Ltd., Kanagawa, Japan

[21] Appl. No.: 400,200

[22] Filed: Jul. 20, 1982

[30] Foreign Application Priority Data

Jul. 20, 1981 [JP] Japan .................................. 56-11317

[51] Int. Cl.$^3$ ............................................... C08F 2/50
[52] U.S. Cl. .......................... 204/159.16; 204/159.23; 204/159.24; 204/159.18; 430/281; 430/920; 430/921
[58] Field of Search ...................... 204/159.23, 159.24, 204/159.16; 430/920, 921, 281

[56] References Cited

U.S. PATENT DOCUMENTS 4,001,017  1/1977  Baumann et al. ............. 204/159.23
4,258,123  3/1981  Nagashima et al. ................ 430/286
4,278,751  7/1981  Specht et al. ................. 204/159.23

FOREIGN PATENT DOCUMENTS 107083  10/1974  Japan .
1467645   3/1977  United Kingdom .
1578662  11/1980  United Kingdom .

OTHER PUBLICATIONS

Derwent Abstract 08330W/05 for Japan Fuji Patent 107083/74.

Primary Examiner—John C. Bleutge
Assistant Examiner—A. H. Koeckert
Attorney, Agent, or Firm—Sughrue, Mion, Zinn, Macpeak, and Seas

[57] ABSTRACT

A photopolymerizable composition is described, which comprises a polymerizable compound containing at least one ethylenically unsaturated double bond and a photopolymerization initiator wherein the photopolymerization initiator is a combination of a 3-keto-substituted cumarin compound and an active halogeno compound. This composition can be easily cured by irradiation with radiation and, therefore, is very useful in the preparation of light-sensitive materials.

7 Claims, No Drawings

PHOTOPOLYMERIZABLE COMPOSITIONS

FIELD OF THE INVENTION

The present invention relates to photopolymerizable compositions and, more particularly, to photopolymerizable compositions containing a specific photopolymerization initiator.

BACKGROUND OF THE INVENTION

It has heretofore been known that when paint, printing ink, adhesive or like compositions containing unsaturated compounds which are curable on irradiation with radiation are irradiated with electromagnetic rays, e.g., visible light ray, ultraviolet ray and X-ray, or corpuscular beams, e.g., electron beam, neutron ray and alpha ray, the unsaturated compounds are polymerized and cured. The presence of a polymerization initiator in the compositions markedly increases the rate of polymerization. These techniques are described in, for example, U.S. Pat. Nos. 3,551,235, 3,551,246, 3,551,311 and 3,558,387, Belgian Pat. No. 808,179, and Japanese Patent Application (OPI) No. 110781/74 (the term "OPI" as used herein refers to a "published unexamined Japanese patent application").

Conventional photopolymerizable compositions can provide cured products having excellent flexibility, chemical resistance, wear resistance, luster, adhesion strength, and hue. However, when forming images with such compositions, it is necessary to apply imagewise exposure for a long period of time because the degree of sensitivity of the compositions to irradiation is low. Therefore, when attempting to form fine images, faithful reproduction, i.e., production of high quality images, becomes impossible if even a slight vibration takes place during handling. When using such compositions, it is necessary to increase the amount of irradiation energy from the light source or the corpuscular beam source and, accordingly, the dissipation of a large amount of heat energy should be taken into account. Furthermore, the use of such a large amount of heat energy is liable to cause the deformation or deterioration of the composition coating formed.

Thus various investigations have been carried out in order to overcome the above-described problems by increasing the sensitivity of photopolymerizable compositions.

Japanese Patent Application (OPI) No. 112681/77 discloses light-sensitive compositions comprising photopolymerizable polymers and at least one 3-keto-substituted cumarin sensitizer having the general formula (I) as described hereinafter, or other cumarin sensitizers. In European Pat. No. 0022188, there is disclosed a photopolymerizable composition in which a mixture of a cumarin compound represented by the general formula (I) as described hereinafter and a reducing compound is used as a photopolymerization initiator.

Japanese Patent Application (OPI) No. 107083/74 and Japanese Patent Publication No. 33723/80 disclose photopolymerizable compositions in which, of active halogeno compounds, sulfonyl halide compounds are used in combination with the compounds represented by the general formula (IV):

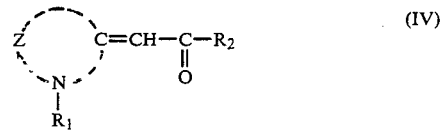

wherein Z is a non-metallic atom group necessary to form a heterocyclic ring containing nitrogen, $R_1$ is alkyl or substituted alkyl group, and $R_2$ is alkyl or aryl group.

Furthermore, in Japanese Patent Application (OPI) No. 74887/79 (corresponding to U.S. Pat. No. 4,258,123), there is disclosed a photopolymerizable composition in which the compound represented by the general formula (II) as described hereinafter is used in combination with the compound represented by the general formula (IV).

The sensitivity of these photopolymerizable compositions, however, are not still sufficient.

SUMMARY OF THE INVENTION

As a result of extensive investigations, it has been found that high sensitivity photopolymerizable compositions can be obtained by combining the 3-keto-substituted cumarin compounds represented by the general formula (I) as described hereinafter with active halogeno compounds such as sulfonyl chloride compounds and the compounds represented by the general formula (II) as described hereinafter.

An object of the invention is to provide a high sensitivity photopolymerization initiator or initiator system for use in a photopolymerizable composition which is a so-called light-sensitive resin (photoresist) composition.

Another object of the invention is to provide a photopolymerization initiator or initiator system which is used to increase the rate of photopolymerization of a photopolymerizable composition containing a polymerizable compound containing an ethylenically unsaturated double bond.

Other objects and advantages of the invention will become apparent from the following detailed explanation.

The present invention, therefore, relates to a photopolymerizable composition containing as essential components a polymerizable compound containing at least one ethylenically unsaturated double bond (which is hereinafter referred to as an "ethylenic compound"; this includes both a monomer and an oligomer, such as a dimer and a trimer, etc.) and a photopolymerization initiator wherein the photopolymerization initiator comprises (A) at least one member of the 3-keto-substituted cumarin compounds represented by the general formula (I) or (I'):

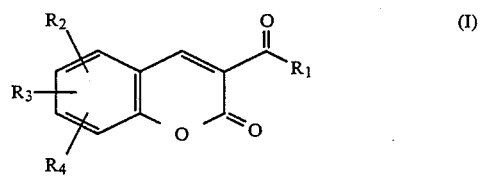

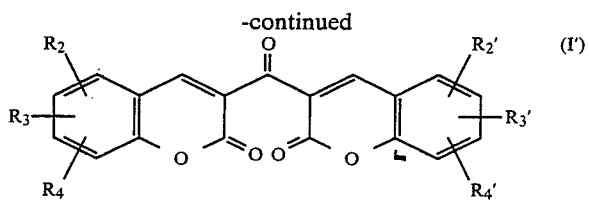

-continued and (B) at least one member of active halogeno compounds capable of easily releasing a free halogen atom.

DETAILED DESCRIPTION OF THE INVENTION

In the general formulae (I) and (I') as described above, $R_1$ is an alkyl group containing from 1 to 10 carbon atoms (preferably methyl group), a substituted or unsubstituted aryl group containing from 6 to 12 carbon atoms (where the substituent includes a dialkylamino group of which each alkyl moiety contains from 1 to 4 carbon atoms, a diarylamino group of which each aryl moiety contains from 6 to 10 carbon atoms, an alkoxy group containing from 1 to 4 carbon atoms and an alkyl group containing from 1 to 4 carbon atoms) (preferably dimethylaminophenyl group, diphenylaminophenyl group, methoxyphenyl group and tolyl group), or a $-(CH=CH)_{\overline{n}}R_5$ group [wherein $R_5$ is a substituted or unsubstituted aryl group containing from 6 to 14 carbon atoms (where the substituent includes a dialkylamino group of which each alkyl moiety contains from 1 to 4 carbon atoms, a diarylamino group of which each aryl moiety contains from 6 to 10 carbon atoms, an alkoxy group containing from 1 to 4 carbon atoms and an alkyl group containing from 1 to 4 carbon atoms) (preferably dimethylaminophenyl group, diphenylaminophenyl group, methoxyphenyl group and tolyl group), or a heterocyclic group in which the number of carbon atoms and hetero atoms constituting the ring is from 5 to 15 (preferably julolidyl group); and n is 1 or 2]; and $R_2$, $R_3$, $R_4$, $R_2'$, $R_3'$ and $R_4'$ are each hydrogen, an alkoxy group containing from 1 to 6 carbon atoms (preferably methoxy group), an alkyl group containing from 1 to 4 carbon atoms, a dialkylamino group of which each alkyl moiety contains from 1 to 4 carbon atoms (preferably dimethylamino group and diethylamino group), a hydroxy group, a halogen atom (preferably chlorine and bromine), a nitro group, or a 5-membered or 6-membered heterocyclic group, and two or three of $R_2$, $R_3$ and $R_4$ or $R_2'$, $R_3'$ and $R_4'$ may combine together to form a condensed ring (preferably naphthalene), or a condensed heterocyclic ring in which the number of carbon atoms and hetero atoms constituting the ring is from 5 to 10 (preferably julolidine).

The active halogeno compounds as used herein are compounds having at least one member of a sulfonylchloro group, a monohalomethyl group, a dihalomethyl group, and a trihalomethyl group which is linked to an aromatic hydrocarbon ring or aromatic heterocyclic ring containing from 2 to 14 carbon atoms.

The ethylenic compound as used herein is a compound containing at least one ethylenically unsaturated double bond and this may be a monomer, a prepolymer, i.e., a dimer, a trimer and other oligomers, a mixture thereof, or a copolymer. Examples of such ethylenic compounds include unsaturated carboxylic acids and their salts, and esters of the unsaturated carboxylic acids and aliphatic polyhydric polyols.

Suitable examples of unsaturated carboxylic acids include acrylic acid, methacrylic acid, itaconic acid, crotonic acid, isocrotonic acid, and maleic acid. Unsaturated carboxylic acid salts include sodium and potassium salts. Preferred unsaturated carboxylic acids are acrylic acid and methacrylic acid.

Suitable examples of aliphatic polyhydric polyols include ethylene glycol, triethylene glycol, tetraethylene glycol, tetramethylene glycol, neopentyl glycol, 1,10-decanediol, trimethylolethane, trimethylolpropane, 1,2-butanediol, 1,3-butanediol, propylene glycol, pentaerythritol, dipentaerythritol, tripentaerythritol, and other pentaerythritol oligomers, sorbitol, d-mannitol, and dihydroxymaleic acid. Preferred aliphatic polyhydric polyols are trimethylolethane, trimethylolpropane, pentaerythritol and dipentaerythritol.

Examples of aliphatic polyhydric polyol-unsaturated carboxylic acid esters include acrylates, methacrylates, itaconates, crotonates, isocrotonates and maleates.

Suitable examples of acrylates include ethylene glycol diacrylate, triethylene glycol diacrylate, 1,3-butanediol diacrylate, tetramethylene glycol diacrylate, propylene glycol diacrylate, trimethylolpropane triacrylate, trimethylolethane triacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol pentaacrylate, dipentaerythritol hexaacrylate, tripentaerythritol octaacrylate, dipentaerythritol tetraacrylate, dipentaerythritol pentaacrylate, dipentaerythritol hexaacrylate, tripentaerythritol octaacrylate, sorbitol triacrylate, sorbitol tetraacrylate, sorbitol pentaacrylate, sorbitol hexaacrylate, and oligomers of acrylic acid ester. Preferred acrylates are trimethylolpropane triacrylate, trimethylolethane triacrylate, pentaerythritol diacrylate, pentaerythritol triacrylate, pentaerythritol tetraacrylate and dipentaerythritol hexaacrylate.

Suitable examples of methacrylates include tetramethylene glycol dimethacrylate, triethylene glycol dimethacrylate, pentaerythritol dimethacrylate, pentaerythritol trimethacrylate, dipentaerythritol dimethacrylate, dipentaerythritol tetramethacrylate, tripentaerythritol octamethacrylate, trimethylolpropane trimethacrylate, trimethylolethane trimethacrylate, ethylene glycol dimethacrylate, 1,3-butanediol dimethacrylate, and sorbitol tetramethacrylate. Preferred methacrylates are pentaerythritol trimethacrylate, pentaerythritol dimethacrylate, dipentaerythritol tetramethacrylate, trimethylolpropane trimethacrylate and trimethylolethane trimethacrylate.

Suitable examples of itaconates include ethylene glycol diitaconate, propylene glycol diitaconate, 1,3-butanediol diitaconate, 1,4-butanediol diitaconate, tetramethylene glycol diitaconate, pentaerythritol diitaconate, dipentaerythritol triitaconate, dipentaerythritol pentaitaconate, dipentaerythritol hexaitaconate, and sorbitol tetraitaconate. Preferred itaconate is dipentaerythritol hexaitaconate.

Suitable examples of crotonates include ethylene glycol dicrotonate, propylene glycol dicrotonate, tetramethylene glycol dicrotonate, pentaerythritol dicrotonate, and sorbitol tetracrotonate. Preferred crotonate is pentaerythritol dicrotonate.

Suitable examples of isocrotonates include ethylene glycol diisocrotonate, pentaerythritol diisocrotonate, and sorbitol tetraisocrotonate. Preferred isocrotonate is pentaerythritol diisocrotonate.

Suitable examples of maleates include ethylene glycol dimaleate, triethylene glycol dimaleate, pentaerythritol dimaleate, and sorbitol tetramaleate. Preferred maleate is pentaerythritol dimaleate.

In addition, there can be mentioned modified tetramethylene glycol diacrylate, modified trimethylolpropane triacrylate, modified pentaerythritol triacrylate, methacrylated epoxy resins, and the like, and furthermore, mixtures of the above-described esters.

Polymerization initiators used in the photopolymerizable compositions of the invention are described below.

Examples of 3-keto-substituted cumarin compounds include 3-acetyl-7-diethylaminocumarin, 3-acetyl-5,7-dimethoxycumarin, 7-diethylamino-3-(4-dimethylaminocinnamoyl)cumarin, 7-diethylamino-3-(4-diphenylaminocinnamoyl)cumarin, 7-diethylamino-3-(4-dimethylaminocinnamylideneacetyl)cumarin, 7-diethylamino-3-(4-diphenylaminocinnamylideneacetyl)cumarin, 5,7-dimethoxy-3-(4-dimethylaminocinnamoyl)cumarin, 5,7-dimethoxy-3-(4-diphenylaminocinnamoyl)cumarin, 5,7-dimethoxy-3-(4-dimethylaminocinnamylideneacetyl)cumarin, 5,7-dimethoxy-3-(4-diphenylaminocinnamylideneacetyl)cumarin, 7-diethylamino-3-[3-(9-julolidyl)acryloyl]cumarin, 5,7-dimethoxy-3-[3-(9-julolidyl)acryloyl]cumarin, 3,3'-carbonylbis(7-diethylaminocumarin), 3,3'-carbonylbis(5,7-dimethoxycumarin), and 3,3'-carbonylbis(benzo[f]cumarin).

Of the above-described 3-keto-substituted cumarin compounds, when taken into account the extent of increasing light-sensitivity, appropriate light-sensitive wavelength regions (for example, in the case of an Ar laser light source, the light-sensitive wavelength region appropriately ranges near 488 nm), compatibility with photopolymerizable compositions, stability with time, firmness of images formed, and so forth, 7-diethylamino-3-(4-dimethylaminocinnamoyl)cumarin, 7-diethylamino-3-(4-diphenylaminocinnamoyl)cumarin, 7-diethylamino-3-[3-(9-julolidyl)acryloyl]cumarin, 3,3'-carbonylbis(7-diethylaminocumarin), and 3,3'-carbonylbis(5,7-dimethoxycumarin) are preferred.

The component (B) of the present photopolymerization initiator is described below.

The component (B), i.e., active halogeno compounds, can be broadly divided into (i) a group of aromatic sulfonyl chloride compounds and (ii) a group of s-triazine compounds substituted by at least one trihalomethyl group.

Suitable examples of aromatic sulfonyl chlorides include benzenesulfonyl chloride, p-toluenesulfonyl chloride, 1-naphthalenesulfonyl chloride, 2-naphthalenesulfonyl chloride, p-chlorobenzenesulfonyl chloride, 4,4'-diphenyldisulfonyl chloride, 4,4'-diphenyletherdisulfonyl chloride, 4,4'-diphenylthioetherdisulfonyl chloride, toluene-3,4-disulfonyl chloride, 2,7-naphthalenedisulfonyl chloride, 4-phenoxybenzenesulfonyl chloride, 4-phenylbenzenesulfonyl chloride, 1-anthraquinonesulfonyl chloride, 2-anthraquinonesulfonyl chloride, 1,5-anthraquinonedisulfonyl chloride, and 1,8-anthraquinonedisulfonyl chloride.

Of the above-described aromatic sulfonyl chlorides, 1-naphthalenesulfonyl chloride, 2-naphthalenesulfonyl chloride, 1-anthraquinonesulfonyl chloride, 2-anthraquinonesulfonyl chloride, 1,5-anthraquinonedisulfonyl chloride, and 1,8-anthraquinonedisulfonyl chloride are preferred.

The s-triazine compounds substituted by at least one trihalomethyl group are represented by the general formula (II):

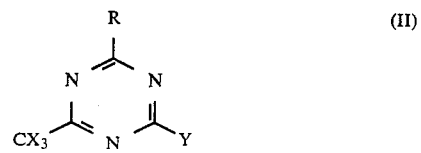

wherein X is a halogen atom (preferably chlorine and bromine); Y is $-CX_3$, $-NH_2$, $-NHR'$, $-NR'_2$, or $-OR'$ (wherein R' is an alkyl group containing from 1 to 4 carbon atoms or an aryl group containing from 6 to 10 carbon atoms; and X is a halogen atom) (preferably $-CCl_3$ and $-CBr_3$); and R is $-CX_3$ (wherein X is a halogen atom), an alkyl group containing from 1 to 12 carbon atoms, a substituted or unsubstituted aryl group containing from 6 to 12 carbon atoms, an alkenyl group containing from 2 to 12 carbon atoms, or a substituted or unsubstituted aralkenyl group containing from 8 to 20 carbon atoms (preferably $-CCl_3$, $-CBr_3$, $-CH_3$,

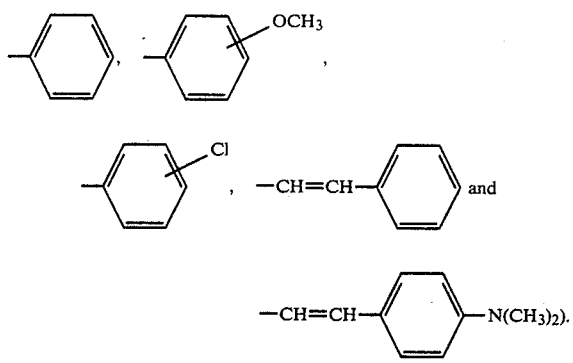

The compounds represented by the general formula (II) include the compounds described in *Bull. Chem. Soc. Japan*, Vol. 42, page 2924 (1969), e.g., 2-phenyl-4,6-bis(trichloromethyl)-s-triazine, 2-(p-chlorophenyl)-4,6-bis(trichloromethyl)-s-triazine, 2-(p-tolyl)-4,6-bis(trichloromethyl)-s-triazine, 2-(p-methoxyphenyl)-4,6-bis(trichloromethyl)-s-triazine, 2-(2',4'-dichlorophenyl)-4,6-bis(trichloromethyl)-s-triazine, 2,4,6-tris(trichloromethyl)-s-triazine, 2-methyl-4,6-bis(trichloromethyl)-s-triazine, 2-n-nonyl-4,6-bis(trichloromethyl)-s-triazine, and 2-(α,α,β-trichloroethyl)-4,6-bis(trichloromethyl)-s-triazine. In addition, there can be mentioned the compounds described in British Pat. No. 1,388,492, e.g., 2-styryl-4,6-bis(trichloromethyl)-s-triazine, 2-(p-methylstyryl)-4,6-bis(trichloromethyl)-s-triazine, 2-(p-methoxystyryl)-4,6-bis(trichloromethyl)-s-triazine, and 2-(p-methoxystyryl)-4-amino-6-trichloromethyl-s-triazine. Moreover, the compounds described in *J. Org. Chem.*, Vol. 29, page 1527 (1964), e.g., 2-methyl-4,6-bis(tribromomethyl)-s-triazine, 2,4,6-tris(tribromomethyl)-s-triazine, 2,4,6-tris(dibromomethyl)-s-triazine, 2-amino-4-methyl-6-tribromomethyl-s-triazine, and 2-methoxy-4-methyl-6-trichloromethyl-s-triazine, can be used.

Of the compounds represented by the general formula (II), those compounds in which Y is $-CX_3$ are particularly preferred.

The above-described 3-keto-substituted cumarin compounds can be prepared by the methods described in, for example, *Chemical Reviews*, Vol. 36, page 1 (1945), *Agr. Univ. J. Research*, Vol. 4, page 345 (1955), and *Chemical Abstract*, Vol. 52, 73076. The bis compounds of the 3-keto-substituted cumarin compounds can be prepared by the method described, for example, in *J. Chem. Eng. Data*, Vol. 12, page 624 (1967).

Suitable examples of the compounds represented by the general formula (I) are shown below:

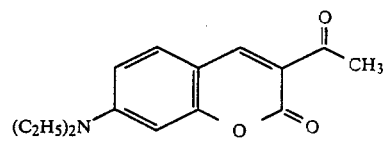

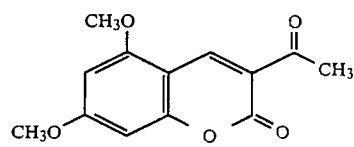

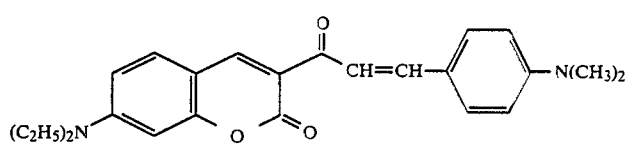

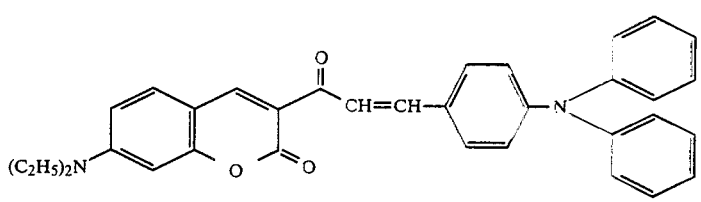

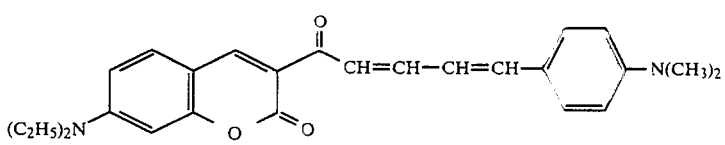

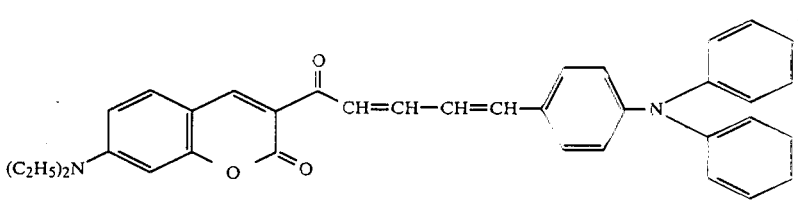

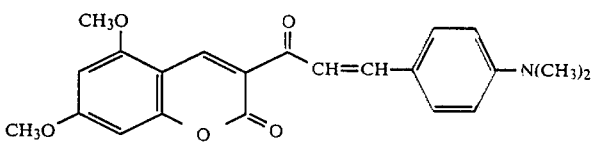

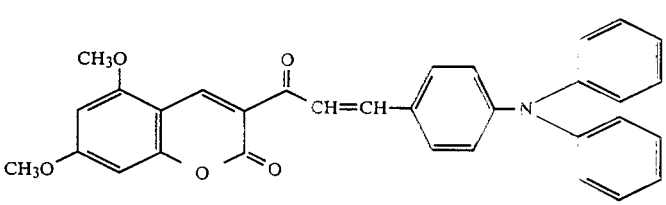

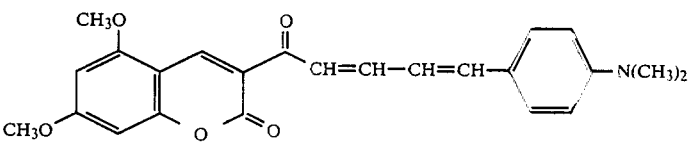

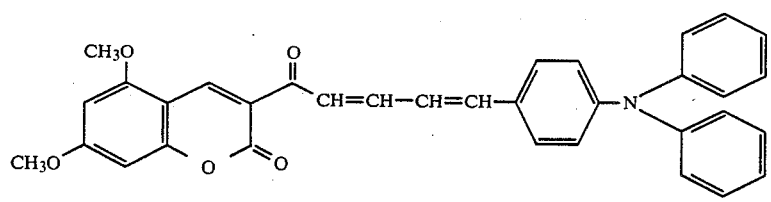
I-j
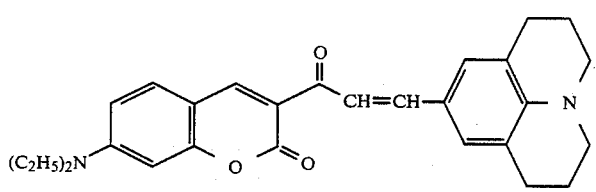
I-k
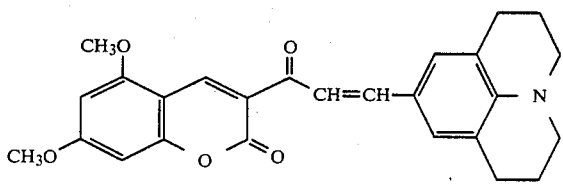
I-l
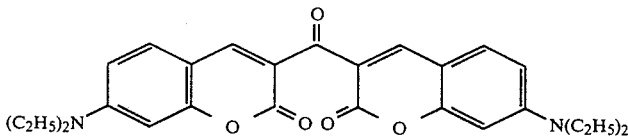
I-m
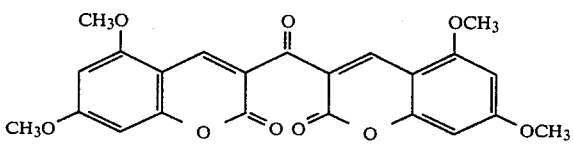
I-n
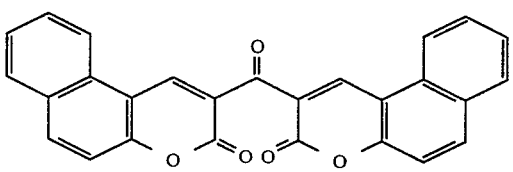
I-o
Preferred 3-keto-substituted cumarin compounds are Compounds (I)-c, (I)-l and (I)-m.
Suitable examples of the s-triazine compounds of the general formula (II) being used as the active halogeno compounds are shown below:
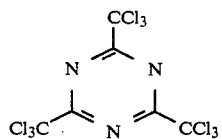
II-a
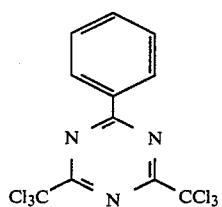
II-b
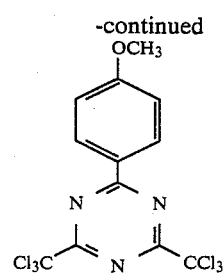
II-c
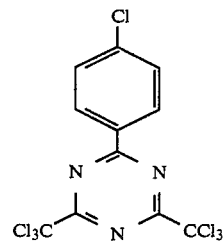
II-d

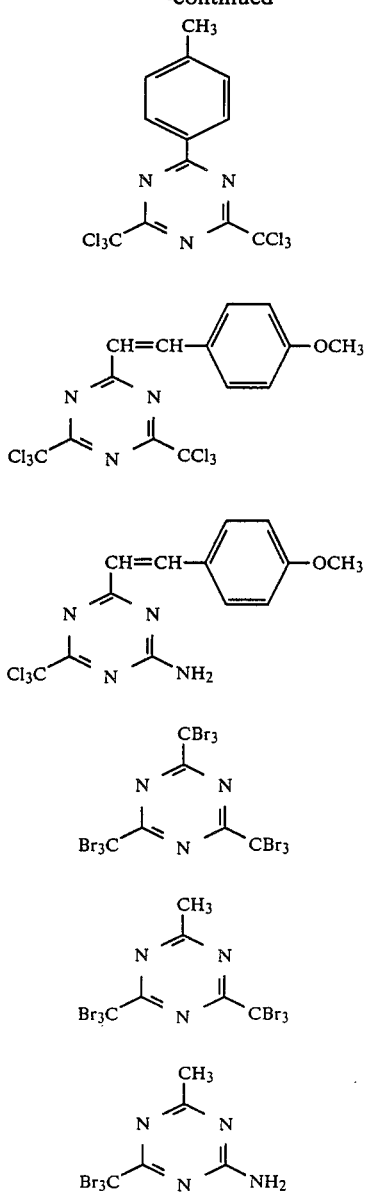

II-e

II-f

II-g

II-h

II-i

II-j

Preferred s-triazine compounds are Compounds (II)-a, (II)-c and (II)-d.

Suitable examples of the sulfonyl chloride compounds being used as the active halogeno compounds are shown below:

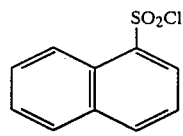

III-a

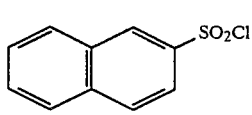

III-b

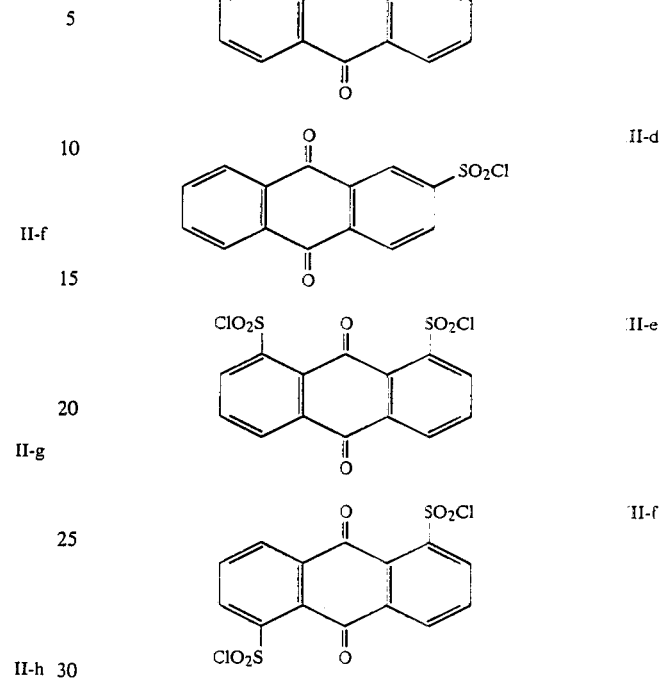

II-c

II-d

II-e

II-f

Preferred sulfonyl chloride compounds are Compounds (III)-b, (III)-c and (III)-f.

The proportion of the photopolymerization initiator in the photopolymerizable composition of the invention can be varied over a wide range such that the weight ratio of the photopolymerization initiator to the ethylenic compound is from about 1/5 to about 1/1,000 and preferably from about 1/10 to about 1/100. In the photopolymerization initiator, the weight ratio of Component (A) to Component (B) is from about 30/1 to about 1/30 and preferably from about 10/1 to about 1/10.

The photopolymerizable composition of the invention containing the above-described ethylenic compound and photopolymerization initiator may further contain, if desired, known additives such as a binder, a thermal polymerization inhibitor, a plasticizer, a coloring agent, and a surface lubricant.

When a thick resist image is intended to form on a light-sensitive material, as is the case with a light-sensitive material which is to be peel-developed and a light-sensitive material which is to be developed with a liquid, a film-forming polymeric substance (as a binder) may be used in combination with the invention. Examples of useful polymeric substances include any organic polymers as long as it has compatibility with compounds containing a polymerizable ethylenically unsaturated double bond. It is preferred, however, to employ those polymeric compounds which permit peel-development, water-development or weak alkaline water-development. These organic polymers act as not only film-forming agents for the photopolymerizable composition of the invention, but also agents which accelerate development. Therefore, depending on the kind of the developer for use in the development, the type of the organic polymer is determined, i.e., there is selected an organic polymer having compatibility with water, weak alkaline water or an organic solvent. For example, the use of water-soluble organic polymeric substances permits water-development.

Examples of such water-soluble organic polymers include addition polymers containing a carboxyl group in the side chain, e.g., methacrylic acid copolymers, acrylic acid copolymers, itaconic acid copolymers, maleic acid copolymers, partially esterified maleic acid copolymers, and crotonic acid copolymers, and acidic cellulose derivatives containing a carboxyl group in the side chain. In addition, hydroxy-containing addition polymers with a cyclic acid anhydride added are useful. Other useful water-soluble organic polymers include polyvinyl pyrrolidone and polyethylene oxide. In order to increase the strength of the coating of the cured area after light-exposure, it is effective to use alcohol-soluble nylon and polyether of 2,2-bis(4-hydroxyphenyl)propane and epichlorohydrin. Preferred water-soluble organic polymers are methacrylic acid copolymers, acrylic acid copolymers, polyvinyl pyrrolidone and polyethylene oxide. Although these organic polymers can be added in any desired proportion, if the proportion of the organic polymer in the photopolymerizable composition exceeds 90% by weight, the results obtained are not desirable with respect to image strength and so forth.

Linear organic polymers which can be used in peel-development include homopolymers and copolymers, such as chlorinated polyolefin (e.g., chlorinated polyethylene and chlorinated polypropylene), polymethyl methacrylate, polyacrylic acid, polymethacrylic acid, polyalkyl acrylate (wherein the alkyl group is a methyl group, an ethyl group, a butyl group or the like), copolymers of acrylic acid alkyl esters (wherein the alkyl group is the same as described above) and at least one monomer of acrylonitrile, vinyl chloride, vinylidene chloride, styrene, butadiene, and the like, polyvinyl chloride, a copolymer of vinyl chloride and acrylonitrile, polyvinylidene chloride, a copolymer of vinylidene chloride and acrylonitrile, polyvinyl acetate, a copolymer of vinyl acetate and vinyl chloride, polyvinyl alcohol, polyvinyl pyrrolidone, polyacrylonitrile, a copolymer of acrylonitrile and styrene, a copolymer of acrylonitrile, butadiene and styrene, polyvinyl alkyl ether (wherein the alkyl group is a methyl group, an ethyl group, an isopropyl group, a butyl group or the like), polymethylvinyl ketone, a polyethylvinyl ketone, polyethylene, polypropylene, polybutyne, polystyrene, poly-α-methyl styrene, polyamides (e.g., 6-nylon and 6,6-nylon), poly-1,3-butadiene, polyisoprene, polyurethane, polyethylene terephthalate, polyethylene isophthalate, chlorinated rubber, polychloroprene, ethyl cellulose, acetyl cellulose, polyvinyl butyral, polyvinyl formal, styrenebutadiene rubber, and poly-chlorosulfonated ethylene. Preferred linear organic polymer is chlorinated polyethylene.

In the case of copolymers, the proportion of each component can be varied within wide limits. In general, however, it is preferred that the proportion of the minor monomer component is from 10 to 50% by mole.

Even thermoplastic polymeric substances other than the above-described polymers can be used in the invention as long as they meet the above-described requirements.

Although the organic polymers can be used singly, they may be used as mixtures comprising two or more thereof which will not separate from each other during the steps of preparation of a coating liquid, coating, and drying.

Suitable examples of thermal polymerization inhibitors which can be used include para-methoxy phenol, hydroquinone, alkyl- or aryl-substituted hydroquinone, tert-butyl catechol, pyrogallol, cuprous chloride, phenothiazine, chloranil, naphthylamine, β-naphthol, 2,6-di-tert-butyl-p-cresol, pyridine, nitrobenzene, dinitrobenzene, p-toluidine, and organic acid-copper compounds (e.g., copper acetate). The amount of the thermal polymerization inhibitor added is preferably from 0.001 to 5 parts by weight per 100 parts by weight of the above-described ethylenic compound. The thermal polymerization inhibitor can be added for the purpose of increasing the stability with time of the photopolymerizable composition of the invention prior to light exposure.

Coloring agents which can be used include pigments such as titanium oxide, carbon black, iron oxide, phthalocyanine-based pigments, and azo-based pigments; and dyes such as Methylene Blue, Crystal Violet, Rhodamine B, Oil Blue, Fuchsin, Auramine, azo-based dyes, and anthraquinone-based dyes. Preferred are those coloring agents which do not absorb light falling within the absorption wavelength of the photopolymerization initiator. The amount of the coloring agent added is, based on 100 parts by weight of the total of the binder and ethylenic compound, from 0.1 to 30 parts by weight in the case of pigments, and from 0.01 to 10 parts by weight and preferably from 0.1 to 3 parts by weight in the case of dyes.

Where the above-described coloring agent is added, it is preferred to add as auxiliary substances for the coloring agent chlorinated aliphatic acids such as dichloromethylstearic acid. The amount of the auxiliary substance added is from 0.005 to 0.5 part by weight per part by weight of the coloring agent. However, when the photopolymerizable composition contains a plasticizer, it is not necessary to add an auxiliary substance.

Plasticizers which can be used in the photopolymerizable composition of the invention include phthalates such as dimethyl phthalate, diethyl phthalate, dibutyl phthalate, diisobutyl phthalate, dioctyl phthalate, octylcapril phthalate, dicyclohexyl phthalate, ditridecyl phthalate, butylbenzyl phthalate and diisodecyl phthalate; glycol esters such as triethyleneglycol dicaprylate; phosphates such as tricresyl phosphate and triphenyl phosphate; aliphatic dibasic acid esters such as diisobutyl adipate, dioctyl adipate, dimethyl sebacate, dibutyl sebacate, dioctyl azelate, and dibutyl maleate; triethyl citrate; glycerol triacetate; and butyl laurate.

Surface lubricants which can be used include lanolin, paraffin wax, and natural wax.

With the above-described various modifiers which can be added to the photopolymerizable composition of the invention, if desired, the amount of the modifier added is up to 3% by weight, preferably up to 1% by weight, based on the total weight of the composition.

Most commonly, the photopolymerizable composition of the invention is dissolved in a solvent to prepare a coating solution, the coating solution thus prepared is coated on a support by a known technique, and the solvent is then removed to provide a photopolymerizable light-sensitive material.

Solvents which can be used in dissolving the photopolymerizable composition of the invention include ketones such as acetone, methyl ethyl ketone, methyl isobutyl ketone, cyclohexanone, and diisobutyl ketone; esters such as ethyl acetate, butyl acetate, n-amyl acetate, methyl formate, ethyl propionate, dimethyl phthalate, ethyl benzoate; aromatic hydrocarbons such as toluene, xylene, benzene, and ethylbenzene; halogenated hydrocarbons such as carbon tetrachloride, trichloroethylene, chloroform, 1,1,1-trichloroethane, monochlorobenzene, and chloronaphthalene; ethers such as tetrahydrofuran, diethyl ether, ethyleneglycol monomethyl ether acetate, and ethyleneglycol monnoethyl ether acetate; dimethylformamide; and dimethyl sulfoxide.

Supports on which the photopolymerizable composition of the invention is applied in a suitable form (ee.g., a solution as described hereinbefore) include plate-like materials and other differently shaped materials which do not undergo significant dimensional changes. Examples of such plate-like materials include glass; silicon oxide; ceramics; paper; metal, e.g., aluminum, zinc, magnesium, copper, iron, chromium, nickel, silver, gold, platinum, palladium, alloys containing aluminum as a major component, alloys containing zinc as a major component, alloys containing magnesium as a major component, a copper-zinc alloy, an iron-nickel-chromium alloy, and alloys containing copper as a major component; metal compounds, e.g., aluminum oxide, tin oxide ($SnO_2$), indium oxide ($In_2O_3$) and cermet; polymers, e.g., regenerated cellulose, cellulose nitrate, cellulose diacetate, cellulose triacetate, cellulose acetate butyrate, cellulose acetate propionate, polystyrene, polyethylene terephthalate, polyethylene isophthalate, polycarbonate of bisphenol A, polyethylene, polypropylene, nylon (e.g., 6-nylon, 6,6-nylon and 6,10-nylon), polyvinyl chloride, a vinyl chloride-vinyl acetate copolymer, a vinyl chloride-acrylonitrile copolymer, a vinyl chloride-vinylidene chloride copolymer, polyacrylonitrile, polymethyl acrylate, and polymethyl methacrylate; and the like.

In addition, supports prepared by firmly laminating two or more thin plates of the above-described materials can be used, including an iron-aluminum laminated plate, an iron-copper-aluminum laminated plate, an iron-chromium-copper laminated plate, paper with polyethylene coated on the surface thereof, paper with cellulose triacetate coated on the surface thereof, an aluminum plate on the surface of which an aluminum oxide layer is formed by anodic oxidation, a chromium plate on the surface of which a chromium oxide layer is formed by a known technique, a glass plate with a tin oxide layer provided on the surface thereof, and a silicon oxide plate with an indium oxide layer provided on the surface thereof.

These supports may be either transparent or opaque, depending on the purpose for which the ultimate light-sensitive image-forming material is used. In addition to colorless transparent supports, colored transparent supports which are prepared by adding dyes or pigments as described in *J. SMPTE*, Vol. 67, page 296 (1958) can be used. Also, in the case of opaque supports, in addition to materials such as paper and metal which are inherently opaque, there can be used those opaque materials which are prepared by adding dyes or pigments such as titanium oxide to transparent materials, such as a plastic film whose surface is treated by the method as described in Japanese Patent Publication No. 19068/72 (corresponding to British Pat. No. 1,237,475), and a plastic film and paper which are made completely light-shielding by the addition of carbon black or the like.

Furthermore, supports on which fine irregularities are formed on the surface thereof by techniques such as sand-graining, electrolytic etching, anodic oxidation, and chemical etching, and supports whose surface is subjected to a preliminary treatment such as corona discharging, irradiation with ultraviolet rays, and a flame treatment, can be used.

Moreover, plastic supports with reinforcing materials, such as glass fiber, carbon fiber, boron fiber, metal fiber, and metal whisker, incorporated thereinto for the purpose of increasing the strength can be used.

On the support may be provided, if desired, other coating layers which are necessary for making the bonding easy, or an antihalation layer, an ultraviolet ray-absorbing layer, and a visible ray-abosrbing layer.

In order to prevent a reduction in sensitivity of the present photopolymerizable composition by oxygen, exposure may be performed by the use of a vacuum printing frame as described in U.S. Pat. No. 3,060,026, or a removable transparent cover may be provided, or a covering layer having low oxygen permeability as described in Japanese Patent Publication No. 17828/65 (corresponding to British Pat. No. 1,001,833) may be provided on a light-sensitive layer.

Factors determining the rate at which the photopolymerizable composition of the invention is photopolymerized, cured, and dried include the type of the support, particularly the properties of the surface thereof, the photopolymerization initiator content of the photopolymerizable composition, the thickness of the photopolymerizable composition layer, the characteristics of a light source (characteristics of radiation spectrum), the light intensity, the presence or absence of oxygen, and the temperature of the surrounding atmosphere.

Irradiation with light may be performed by any one of various known techniques or a combination thereof. For example, any light source having any shape may be used to expose the photopolymerizable composition to active rays therefrom as long as it can provide an effective exposure amount. The reason for this is that the photopolymerizable composition of the invention generally exhibits the maximum sensitivity to ultraviolet rays and visible light having wavelengths ranging between about 180 nm and about 600 nm. In addition, since the photopolymerizable composition of the invention is sensitive to electromagnetic waves having short wavelengths, e.g., vacuum ultraviolet ray, X-ray and $\gamma$-ray, and corpuscular beams, e.g., electron beam, neutron ray, and $\alpha$-ray, they can also be utilized for imagewise exposure. Suitable examples of light sources having ultraviolet and visible ray regions include a carbon arc lamp, a mercury vapor lamp, a xenon lamp, a fluorescent lamp, an argon glow discharge tube, a flash lamp for photography, a van de Graaff accelerator, and various laser lights.

The light irradiation time should be sufficient to provide an effective exposure amount. Although the light irradiation may be performed at any favorable temperature, it is most suitable from a practical viewpoint that the irradiation is performed at room temperature, i.e., within the range of from 10° to 40° C.

The composition of the invention cured by irradiation with light is dry and elastic, exhibits wear resistance and chemical resistance and, furthermore, has excellent ink receptivity, hydrophilic-hydrophobic equilibrium, stain-removing properties, initial roll-up properties, and so forth. It is, therefore, suitable particularly in applications such as a lithographic printing plate material which has been previously provided with light sensitivity and a photoresist. Furthermore, the photopolymerizable composition of the invention can be used as a printing ink; an adhesive for metallic foils, films, paper, fabrics, and the like; a photocurable paint for metals, plastics, paper, wood, metallic foils, fabrics, glass, cardboard, cardboard for use in the preparation of containers, and the like; marks on roads, parking areas, air ports, and the like; and so forth.

Where the photopolymerizable composition of the invention is used as a vehicle for a printing ink, it can be colored by a predetermined amount of dye and, at the same time, can be colored by various known organic pigments, e.g., molybdenate orange, titanium white, chromium yellow, phthalocyanine blue, carbon black, and the like. The amount of the vehicle is from about 20 to 99.9% by weight based on the total weight of the composition, and the amount of the coloring agent is from about 0.1 to 80% by weight based on the total weight of the composition. Printing materials include paper, clay-coated paper, and cardboard for the preparation of containers.

The photopolymerizable composition of the invention is further suitable for use in the treatment of fabrics of natural fiber or synthetic fiber. For example, it can be used in a vehicle for cloth-printing ink or in a vehicle for use in the special treatment of fabrics which is applied for the purpose of providing waterproofing properties, oil resistance, stain resistance, fold resistance, and so forth.

When the photopolymerizable composition of the invention is used as an adhesive, at least one of the materials which are to be bonded with the adhesive should be translucent to ultraviolet light or visible light. Typical examples of such laminated products produced by the use of the composition of the invention include cellophane with a polymer coated thereon, e.g., cellophane with polypropylene coated thereon, metal (e.g., aluminum or copper) with a polyethylene terephthalate film coated thereon, and aluminum with polypropylene provided thereon.

The photopolymerizable composition of the invention can be used as a paint which is used to coat or print on the surface of metal, glass or plastic by a spray method or a roller method. For glass, a polyester film, a vinyl polymer film, cellophane with a polymer coated thereon, e.g., treated or untreated polyethylene or polypropylene for use in a throw-away cup or bottle, and the like, there may be employed a color coating method. Examples of metals which may be coated include tinplate on which sizing has been provided or not provided.

In imagewise exposure of a light-sensitive image-forming material using the photopolymerizable composition of the invention, predetermined areas of the photopolymerizable composition layer is exposed to light until the addition polymerizable reaction at the imagewise exposed areas reaches the desired thickness and is completed. Unexposed areas of the photopolymerizable composition layer are then removed by using a solvent which is capable of dissolving the ethylenic compound (monomer) or prepolymer alone without dissolving the polymer, or by a so-called peel-development.

When the photopolymerizable composition of the invention is used in a light-sensitive image-duplicating material, the thickness of the photopolymerizable composition layer after being freed of a solvent is from 2 to 150 μm and preferably from 3 to 100 μm. As the thickness of the layer is increased, the flexibility is reduced, and the wear resistance is decreased with a reduction in the thickness of the layer.

In cases where the photopolymerizable composition of the invention is used as a printing ink, a paint composition, and an adhesive, it can be used without the use of a volatile solvent. In this case, the resulting ink or paint has some advantages over the conventional oil-containing resin or solvent type ink or paint.

The following example is given to illustrate the invention in greater detail although the invention is not limited thereto.

EXAMPLE

(1) Preparation of Light-Sensitive Material

An ethylenic compound (3.6 g of pentaerythritol tetraacrylate), a binder [5.0 g of benzyl methacrylatemethacrylic acid copolymer (73/27 by weight) (intrinsic viscosity in methyl ethyl ketone (MEK) at 30° C.: 0.12)], a photopolymerization initiator (2.5 mol% of each Component (A) and Component (B) per mol of pentaerythritol tetraacrylate monomer; molar ratio of Component (A) to Component (B): 1/1) as shown in Table 1 and a coloring agent (0.1 g of Oil Blue) were placed in a container along with 20 g of methyl ethyl ketone (solvent) and 20 g of ethyleneglycol monomethyl ether acetate (solvent) and dissolved therein by stirring. The solution thus prepared was then coated on an aluminum plate by means of a spinner or a whirler (a rotary coating apparatus) and dried at 100° C. for 5 minutes to form a light-sensitive layer (a photopolymerizable composition layer). The thickness of the light-sensitive layer after drying was about 2 μm.

(2) Measurement of Sensitivity of Light-Sensitive Material

A stepwedge having optical density increments of 0.15 was placed on the light-sensitive layer of the light-sensitive material. The light-sensitive layer was exposed to light for 10 seconds at a distance of 50 cm from a light source (a super high voltage mercury lamp; output: 2 kw) and then treated with a developer having the composition shown below to remove unexposed areas.

| Developer | |
| --- | --- |
| Trisodium phosphate | 25 g |
| Monosodium phosphate | 5 g |
| Butyl cellosolve | 70 g |
| Polyoxyethylene octylphenyl ether | 2 ml |
| Water | 1 l |

The sensitivity of the material is expressed as the maximum step number of the stepwedge corresponding to the appearing image. Larger step numbers indicate higher sensitivity.

The results are shown in Table 1 below.

TABLE 1

| Run No. | Photopolymerization Initiator | | Sensitivity (step number of step wedge) |
| --- | --- | --- | --- |
| | Component (A) | Component (B) | |
| 1 (sample of the invention) | I-c | II-a | 9 |
| 2 (sample of the invention) | I-c | III-b | 5 |
| 3 (sample of the invention) | I-c | III-c | 8 |
| 4 (sample of the invention) | I-l | II-a | 7 |

TABLE 1-continued

| Run No. | Photopolymerization Initiator Component (A) | Photopolymerization Initiator Component (B) | Sensitivity (step number of step wedge) |
|---|---|---|---|
| 5 (sample of the invention) | I-l | III-c | 4 |
| 6 sample of the invention) | I-m | II-a | 12 |
| 7 (sample of the invention) | I-m | III-b | 6 |
| 8 (sample of the invention) | I-m | III-c | 11 |
| 9 (comparative example) | I-c | — | 1 |
| 10 (comparative example | I-l | — | 0 |
| 11 (comparative example) | I-m | — | 0 |
| 12 (comparative example | — | II-a | 0 |
| 13 (comparative example) | — | III-b | 0 |
| 14 (comparative example) | — | III-c | 0 |

As can be seen from Table 1, of the photopolymerizable compositions containing pentaerythritol tetraacrylate as an ethylenic compound, the photopolymerizable compositions containing a combination of Component (A) and Component (B) as a photopolymerization initiator have much higher sensitivity than the photopolymerizable compositions wherein the photopolymerization initiator used was Component (A) of 3-keto-substituted cumarin compound alone or Component (B) of active halogeno compound alone. In particular, the photopolymerizable compositions containing a photopolymerization initiator consisting of a 3-keto-substituted cumarin and an active halogeno compound wherein the 3-keto-substituted cumarin is 7-diethylamino-3-(4-dimethylaminocinnamoyl)cumarin, 7-diethylamino-3-[3-(9-julolidyl)acryloyl]cumarin, or 3,3'-carbonylbis(7-diethylaminocumarin), and the active halogeno compound is 2-naphthalenesulfonyl chloride, 1-anthraquinonesulfonyl chloride or 2,4,6-tris(trichloromethyl)-s-triazine have high sensitivity.

While the invention has been described in detail and with reference to specific embodiments thereof, it will be apparent to one skilled in the art that various changes and modifications can be made therein without departing from the spirit and scope thereof.

What is claimed is:

1. A photopolymerizable composition comprising a polymerizable compound containing at least one ethylenically unsaturated double bond and a photopolymerization initiator wherein the photopolymerization initiator is a combination of a 3-keto-substituted cumarin compound and an active halogeno compound, and
   wherein the 3-keto-substituted cumarin compound is at least one member selected from the compounds represented by the general formula (I) or (I'):

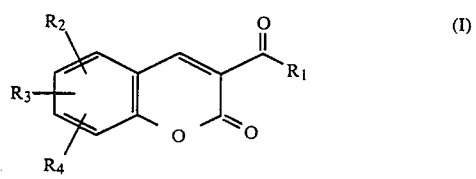

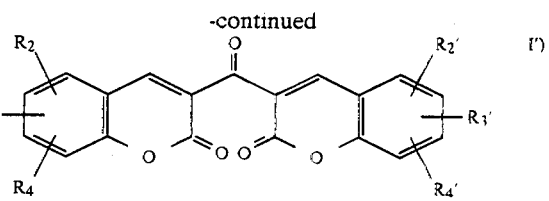

wherein $R_1$ is (1) an alkyl group containing from 1 to 10 carbon atoms, (2) a substituted or unsubstituted aryl group containing from 6 to 12 carbon atoms, where the substituent for the substituted aryl group $R_1$ is a dialkylamino group with the alkyl moiety containing from 1 to 4 carbon atoms, a diarylamino group with the aryl moiety containing from 6 to 10 carbon atoms, an alkoxy group containing from 1 to 4 carbon atoms, or an alkyl group containing from 1 to 4 carbon atoms, or (3) a $-(CH=CH)_nR_5$ group wherein $R_5$ is (a) a substituted or unsubstituted aryl group containing from 6 to 14 carbon atoms where the substituent for the substituted aryl group $R_5$ is a dialkylamino group with the alkyl moiety containing from 1 to 4 carbon atoms, a diarylamino group with the aryl moiety containing from 6 to 10 carbon atoms, an alkoxy group containing from 1 to 4 carbon atoms, or an alkyl group containing from 1 to 4 carbon atoms, or (b) a heterocyclic group in which the number of carbon atoms and hetero atoms constituting the ring is from 5 to 15; and n is 1 or 2; and $R_2$, $R_3$, $R_4$, $R_2'$, $R_3'$, and $R_4'$ are each hydrogen, an alkoxy group containing from 1 to 6 carbon atoms, an alkyl group containing from 1 to 4 carbon atoms, a dialkylamino group with the alkyl moiety containing from 1 to 4 carbon atoms, a hydroxy group, a halogen atom, a nitro group, or a 5-membered or 6-membered heterocyclic group, and two or three of $R_2$, $R_3$ and $R_4$ or $R_2'$, $R_3'$ and $R_4'$ may combine together to form a condensed ring, or a condensed heterocyclic ring in which the number of carbon atoms and hetero atoms constituting the ring is from 5 to 10, and wherein the active halogeno compound is at least one member selected from the group consisting of aromatic sulfonyl chloride compounds and s-triazine compounds substituted by at least one trihalomethyl group.

2. The photopolymerizable composition as claimed in claim 1, wherein the active halogeno compound is at least one aromatic sulfonylhalide compound selected from the group consisting of 1-naphthalenesulfonyl chloride, 2-naphthalenesulfonyl chloride, 1-anthraquinonesulfonyl chloride, 2-anthraquinonesulfonyl chloride, 1,5-anthraquinonedisulfonyl chloride, and 1,8-anthraquinonedisulfonyl chloride.

3. The photopolymerizable composition as claimed in claim 1, wherein the active halogeno compound is at least one member selected from the compounds represented by the general formula (II):

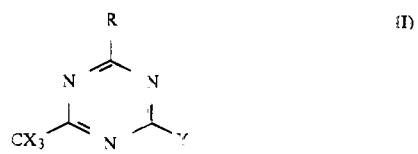

wherein X is a halogen atom; Y is $-CX_3$, $-NH_2$, $-NHR'$, $-NR'_2$, or $-OR'$ (wherein R' is an alkyl group containing from 1 to 4 carbon atoms or an aryl group containing from 6 to 10 carbon atoms); and R is $-CX_3$, an alkyl group containing from 1 to 12 carbon atoms, a substituted or unsubstituted aryl group containing from 6 to 12 carbon atoms, an alkenyl group containing from 2 to 12 carbon atoms, or a substituted or unsubstituted aralkenyl group containing from 8 to 20 carbon atoms.

4. The photopolymerizable composition as claimed in claim 1, wherein the weight ratio of the photopolymerization initiator to the polymerizable compound is in the range of from about 1:5 to about 1:1,000.

5. The photopolymerizable composition as claimed in claim 4, wherein the weight ratio of the photopolymerization initiator to the polymerizable compound is in the range of from about 1:10 to about 1:100.

6. The photopolymerizable composition as claimed in claim 1, wherein the weight ratio of the 3-keto-substituted cumarin compound to the active halogeno compound is in the range of from about 30:1 to about 1:30.

7. The photopolymerizable composition as claimed in claim 6, wherein the weight ratio of the 3-keto-substituted cumarin compound to the active halogeno compound is in the range of from about 10:1 to about 1:10.

* * * * *

UNITED STATES PATENT AND TRADEMARK OFFICE
CERTIFICATE OF CORRECTION

PATENT NO. : 4,505,793
DATED : March 19, 1985
INVENTOR(S) : Koji Tamoto, Akira Umehara & Teruo Nagano.

It is certified that error appears in the above-identified patent and that said Letters Patent is hereby corrected as shown below:

On the title page;

On the cover, under "Foreign Application Priority Date", please change "56-11317" to --56-113178--.

Signed and Sealed this

Twentieth Day of August 1985

[SEAL]

Attest:

DONALD J. QUIGG

Attesting Officer

Acting Commissioner of Patents and Trademarks